(12) United States Patent
Gerpheide

(10) Patent No.: US 7,002,821 B2
(45) Date of Patent: Feb. 21, 2006

(54) ZERO DRIFT ANALOG MEMORY CELL, ARRAY AND METHOD OF OPERATION

(76) Inventor: George E. Gerpheide, 3481 S. Monte Verde, Salt Lake City, UT (US) 84109

( * ) Notice: Subject to any disclaimer, the term of this patent is extended or adjusted under 35 U.S.C. 154(b) by 91 days.

(21) Appl. No.: 10/822,555

(22) Filed: Apr. 12, 2004

(65) Prior Publication Data

US 2005/0007802 A1 Jan. 13, 2005

Related U.S. Application Data

(60) Provisional application No. 60/462,372, filed on Apr. 11, 2003.

(51) Int. Cl.
G11C 27/00 (2006.01)

(52) U.S. Cl. ............... 365/45; 365/189.03; 348/241
(58) Field of Classification Search ............ 365/45, 365/189.03, 189.04, 191, 189.08; 348/241, 348/250
See application file for complete search history.

(56) References Cited

U.S. PATENT DOCUMENTS

| | | | | |
|---|---|---|---|---|
| 3,363,113 A | | 1/1968 | Bedingfield | |
| 4,764,752 A | * | 8/1988 | Ormond | 341/167 |
| 5,007,042 A | * | 4/1991 | Santi | 370/212 |
| 5,479,170 A | | 12/1995 | Cauwenberghs et al. | |
| 6,018,364 A | * | 1/2000 | Mangelsdorf | 348/241 |
| 6,801,445 B1 | * | 10/2004 | Knodgen | 365/45 |

OTHER PUBLICATIONS

Chris Diorio, Sunit Mahajan, Paul Hasler, Bradley Minch and Carver Mead; A High-Resolution Nonvolatile Analog Memory Cell; 1995; 4 pages; vol. 3; Pasadena, California.

Gert Cauwenberghs and Amnon Yariv; Fault-Tolerant Dynamic Multilevel Storage in Analog VLSI, Dec. 1994, 3 pages, vol. 4, No. 12.

Reid R. Harrison, Julian A. Bragg, Paul Hasler, Bradley A. Minch, and Stephen P. Deweerth; A CMOS Programmable Analog Memory-Cell Array Using Floating-Gate Circuits; Jan. 2001; 8 pages; vol. 48, No. 1.

RF and Communications Resources; Nonvolatile Memory Digital Potentiometers From Analog Devices Maintain Settings Following Power Loss; copy of web page (www.analog.com); Aug. 13, 2001; 1 page; Norwood, Massachusetts.

Gert Cauwenberghs; Adaptation, Learning and Storage in Analog VLSI, copy of web page (www.bach.ece.jhu.edu); Sep. 1996, 9 pages; Rochester, New York.

\* cited by examiner

*Primary Examiner*—Richard Elms
*Assistant Examiner*—Hien Nguyen
(74) *Attorney, Agent, or Firm*—Morriss O'Bryant Compagni, P.C.

(57) ABSTRACT

A zero-drift analog memory (ZDAM) cell that indefinitely maintains an output signal at a discrete voltage while the memory circuit is powered, wherein the memory circuit receives an input signal, passes the input signal to a storage element upon receiving an assertion signal, maintains an output signal at a level of the input signal when the assertion signal is removed, and utilizes a zero-drift transfer function feedback loop on the output signal to maintain the output signal. A memory array including a plurality of ZDAM cells and method of operation are also disclosed.

37 Claims, 8 Drawing Sheets

ZERO DRIFT ANALOG MEMORY CELL, ARRAY AND METHOD OF OPERATION

CROSS-REFERENCE TO RELATED APPLICATIONS

This utility patent application claims priority to U.S. provisional patent application Ser. No. 60/462,372, filed Apr. 11, 2003.

BACKGROUND OF THE INVENTION

1. Field of the Invention

The present invention relates generally to memory devices. More particularly, the present invention pertains to analog memory circuits that are capable of long-term memory storage without losing data integrity.

2. Description of Related Art

Sample and hold circuits are a well known and conventional method of storing analog information. FIG. 1 illustrates a circuit diagram of an conventional sample and hold circuit implemented with analog circuitry. One problem with the conventional sample and hold circuit is the leakage current represented by $R_{leak}$ which causes a non-negligible drift of the output voltage, $V_{OUT}$. Note that $R_{leak}$ may also be connected between point H and ground. This voltage drift of a conventional sample and hold circuit may become significant period of a few minutes or even seconds. There have been many attempts in the prior art to overcome this fundamental problem, but, there tends to remain at least some measurable leakage current and usually with significant added cost from additional circuitry.

FIG. 2 is a circuit diagram of an exemplary sample and hold circuit using digital circuit elements according to the prior art. The input voltage, $V_{IN}$, is input to an analog-to-digital (A/D) converter, and then digitally stored in latch. The digital value can then be reconverted to an analog output voltage, $V_{OUT}$, by using a digital-to-analog (D/A) converter. It should be apparent that a digital latch circuit as shown in FIG. 2 will hold a number indefinitely, thereby eliminating voltage drift of $V_{OUT}$. However, a significant amount of circuitry is required to implement the A/D and D/A conversions required, thus, resulting in a large die area and significant cost disadvantages.

FIG. 3 is a circuit diagram of a tunnel injection device in a static analog memory circuit of the prior art, e.g., Diorio et al., "A High-Resolution Nonvolatile Analog Memory Cell", Proceedings of the 1995 IEEE International Symposium on Circuits and; Systems, Vol. 3, pp. 2233–36, 1995. Although the static analog memory circuit is capable of generating a desired output voltage, $V_{OUT}$, that will not drift, such a circuit typically must be implemented using non-standard voltages or non-standard integrated circuit processes, making the circuit difficult and expensive to use.

U.S. Pat. No. 5,479,170 to Cauwenberghs et al. discloses a long-term storage dynamic analog memory. The Cauwenberghs et al. device includes a binary quantizer and increment/decrement means for iteratively adjusting the stored analog value to proximity with one of a set of predetermined discrete analog memory levels. However, the Cauwenberghs et al. device appears to require an A/D converter and its associated cost.

Accordingly, there exists a need in the art for a dynamic analog memory circuit that eliminates output voltage, $V_{OUT}$, drift over a significant period of time, while using standard voltages and integrated circuit processes and minimal circuitry.

BRIEF SUMMARY OF THE INVENTION

A zero-drift analog memory (ZDAM) cell is disclosed. The ZDAM cell may include an input signal and a sample signal having sample and hold states. The ZDAM cell may further include a tank for receiving the input signal and the sample signal and configured for generating and holding an output signal during the sample and hold states, respectively. The ZDAM cell may further include a zero-drift transfer function (ZDF) feedback loop disposed in parallel with the tank and configured to maintain the output signal at a desired analog signal level during the hold state. An array of ZDAM cells and a method of operation are also disclosed.

Additional features and advantages of the invention will be apparent from the detailed description which follows, taken in conjunction with the accompanying drawings, which together illustrate, by way of example, features of embodiments of the present invention.

BRIEF DESCRIPTION OF THE SEVERAL VIEWS OF THE DRAWINGS

The following drawings illustrate exemplary embodiments for carrying out the invention. Like reference numerals refer to like parts in different views in the drawings or embodiments of the present invention.

DETAILED DESCRIPTION OF THE INVENTION

Reference will now be made to the drawings in which the various elements of the present invention will be given numerical designations and in which the invention will be discussed so as to enable one skilled in the art to make and use the invention. It is to be understood that the following description is only exemplary of the principles of the present invention, and should not be viewed as narrowing the claims which follow.

Embodiments of the present invention allow storage of an analog signal without any drift of that analog signal which is an inherent problem in the prior art memory circuits. While the following exemplary embodiments are electronic implementations of the present invention, the invention is not limited to electronic implementations. An important aspect of the present invention is that it may be implemented from electronic, optical, biologic, neural, chemical or other circuit elements. For example, the input and output signals shown in the following embodiments are voltage signals in the electronic embodiments shown. Such input and output signals might instead be action signals in a neural system implementation, or frequency signals in a wireless communication system implementation, or light signals in an optical system implementation.

According to a memory circuit embodiment of the present invention, an analog value is presented at an input the memory circuit. A sample is taken from the input signal and stored therein. The memory circuit generates an output signal that is the same as the input signal. The output signal must track the input signal as long as the sample is being asserted at the input. When the sample is no longer being asserted, thus moving to a "hold" signal, the output signal is remembered at the last asserted input signal value.

Figure 1:
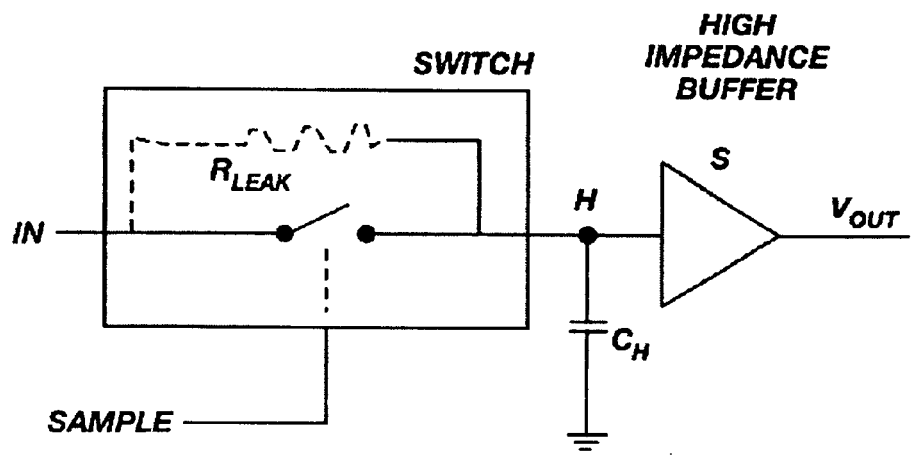
FIG. 1 is a circuit diagram of conventional analog sample and hold circuit.
Figure 2:
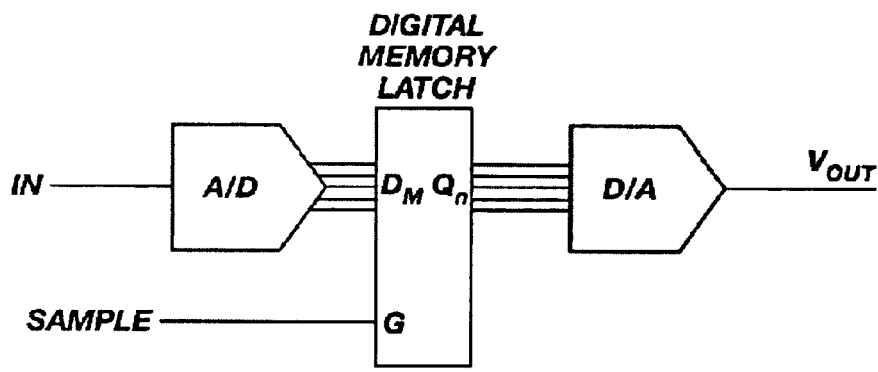
FIG. 2 is a circuit diagram of an exemplary sample and hold circuit using digital circuit elements according to the prior art.
Figure 3:
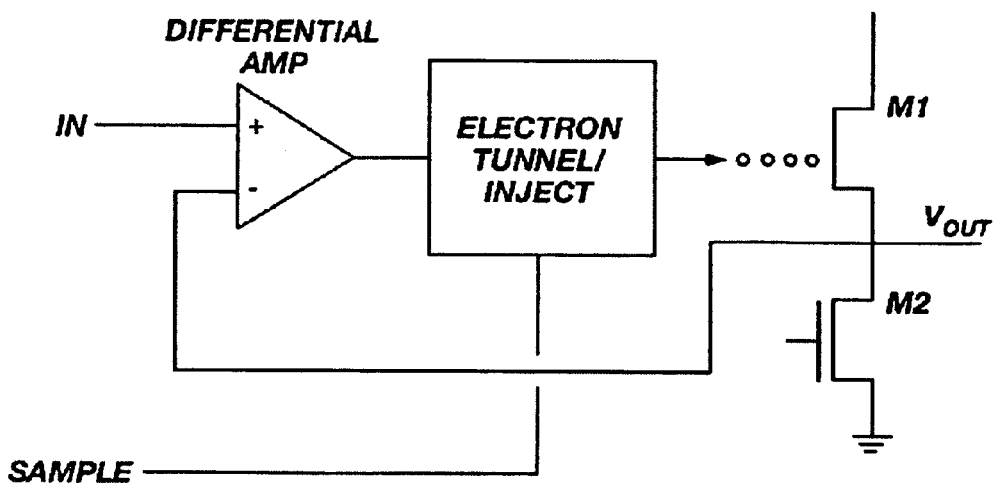
FIG. 3 is a circuit diagram of a tunnel injection device in a static analog memory circuit according to the prior art.
Figure 4:
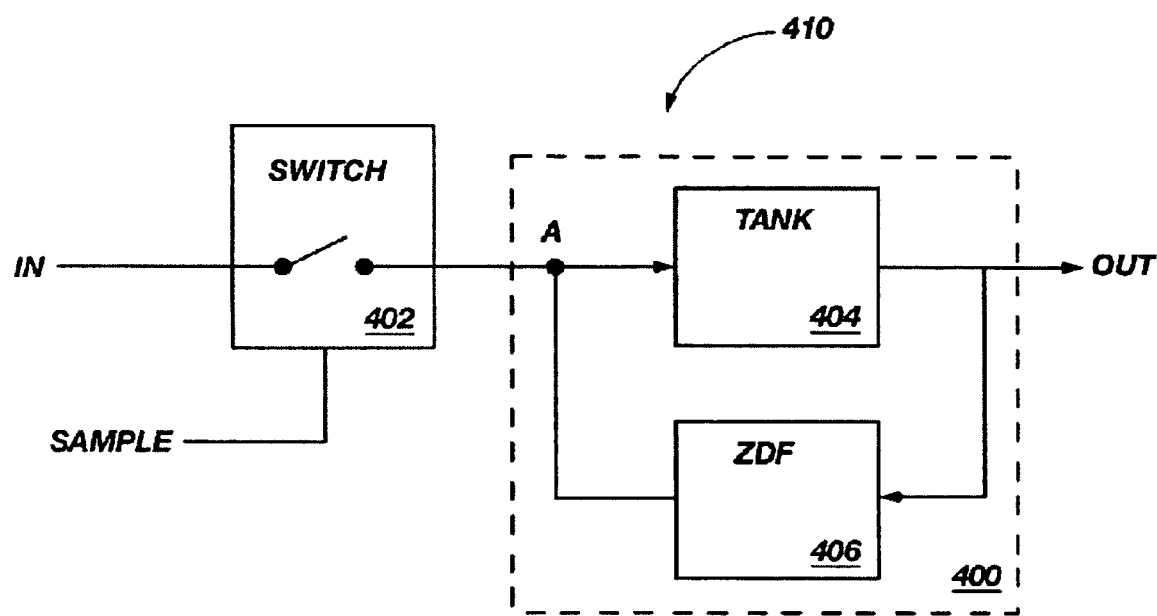
FIG. 4 is a circuit diagram of an embodiment of a zero-drift analog memory cell according to the present invention.

FIG. 4 is a circuit diagram of a embodiments of a zero-drift analog memory (ZDAM) cell 400, 410 according to the present invention. A general embodiment of a ZDAM memory cell 400 consistent with the present invention includes a tank 404 and a zero-drift feedback (ZDF) 406 in parallel with the tank 404. Another embodiment of a ZDAM memory cell 410 may further include a switch 402 in communication with a tank 404 and a zero-drift feedback (ZDF) 406 in parallel with the tank 404. In this particular electrical embodiment of a ZDAM memory cell 410, the tank 404 may be a capacitor capable of storing a voltage. According to alternative embodiments, tank 404 may be any electronic circuit, e.g., a low pass filter, capable of storing an analog voltage characterized by voltage drift over time. According to a particular capacitor embodiment, the tank 404 may be a 1 pF capacitor, with capacitance drift of up to 1 fC in 1/4,000 second, corresponding to 4 pC/sec, corresponding to a leakage current of 4 pA, or voltage drift of 4 V/sec.

The operation of the ZDAM memory cell 410 follows. An input signal, IN, is input to the switch 402. Upon activation of the switch 402 by the sample signal (sample state), the input signal, IN, is entered into the tank 404 for storage. The function of the ZDF 406 is to hold the output signal, OUT, of the tank 404 at the desired asserted input signal value or at an arbitrarily closely quantified version of the input signal. ZDF 406 performs this function by generating a correction signal that is input back into the tank 404. Thus, a first aspect of the invention is the concept of providing the ZDF to perform this function, regardless of specific circuit implementation. For electronic embodiments of the present invention, input signal, IN and output signal, OUT may be $V_{IN}$ and $V_{OUT}$, i.e., analog voltages, respectively.

Figure 5:
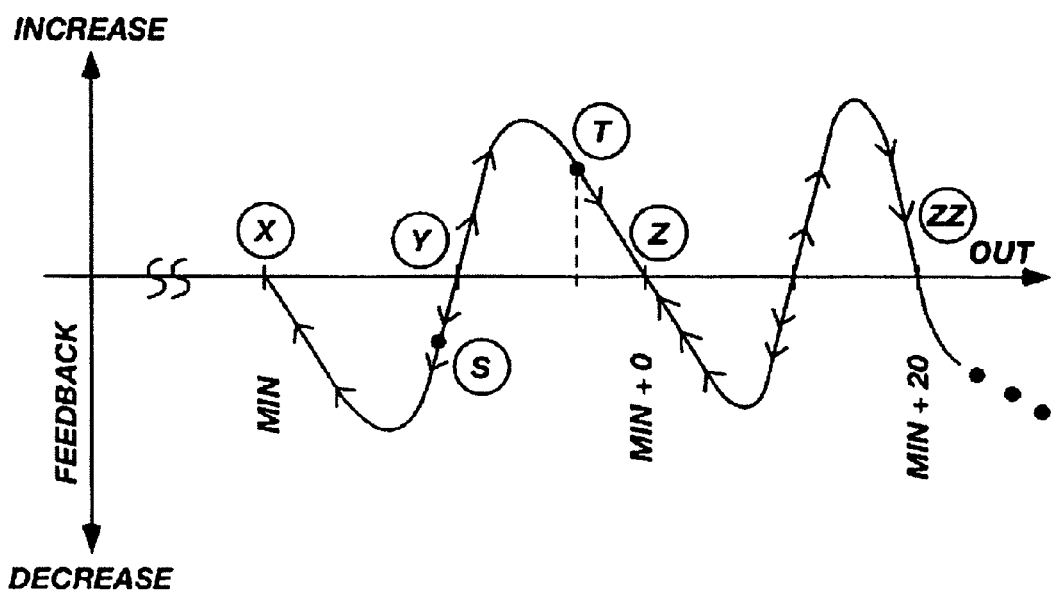
FIG. 5 is a graph of an embodiment of a ZDF transfer function according to an embodiment of the present invention.

The operation of the ZDF transfer function is illustrated in the graph in FIG. 5. The x-axis of the graph in FIG. 5 shows the value of the output signal from a minimum to a maximum. The values of OUT are quantized into discrete points, determined by the maximum value minus the minimum value, all divided by number of discrete units desired. The y-axis of the graph in FIG. 5 shows the correction signal fed back into the tank 404 such that the value stored in tank 404 will increase or decrease. Of course, it will be apparent to one of skill in the art that that this scale and number of zero-crossings can be modified for a particular application.

When the SAMPLE signal is asserted (sample state), the switch 402 conducts the signal value on IN to node A. The feedback signal to A from the ZDF 406 may be "overpowered" during the sample state and the ZDF feedback has no significant effect when the SAMPLE signal is asserted.

The tank 404 provides a storage function that essentially copies whatever signal value present on node A to output signal, OUT. The storage nature of tank 404 means that the tank 404 adds a low-pass filtering or delay aspect to the input signal, IN. In the absence of influences from the SWITCH or ZDF, tank 404 will tend to maintain or store the value at the output signal, OUT. However, tank 404 is not a perfect storage element and the value at the output signal, OUT will drift (downward or upward) in the absence of such influences.

When the SAMPLE signal is no longer asserted, the switch 402 no longer conducts and the value at node A is determined by the storage nature of tank 404 and the influence of feedback from ZDF 406.

ZDF 406 provides feedback to increase or decrease the value at node A as a cyclic function of the value at the output signal, OUT, that is presented to ZDF 406, as shown in FIG. 4. The transfer function of ZDF 406 can have a variety of shapes subject to the requirements that it is: (a) cyclic, meaning that it crosses zero at many points, and (b) diatonic between zero-crossings, meaning that between zero-crossings there is one segment with positive slope and one segment with negative slope. Each negative-going zero crossing determines a stable "quantization" value at which OUT can be held. In FIG. 5, those zero-crossings are labeled "MIN", "MIN+Q", "MIN+2Q", up to "MAX" (not shown). Thus, OUT will not be held with infinite resolution, but instead is quantized to these values. In a typical system embodiment according to the present invention, there may be 100 quantization values, meaning the resolution is 1:100. It is not necessary, but is typical that the quantization values are evenly spaced, e.g., every 'Q' units in the graph of FIG. 5.

Further details of the ZDF transfer function are also shown in FIG. 5 and can be used to understand the Zero-Drift aspect of the invention. Values of OUT labeled "X", "Z", and "ZZ" in FIG. 5 are stable quantization values. Suppose that OUT is between "X" and "Y", for example point "S", when SAMPLE is released (hold state). Then the ZDF 406 provides "decrease" feedback to node A and tank 404 that causes node A and OUT to decrease in value. OUT will decrease from "S" to "X", at which point the feedback becomes null. The negative slope at "X" creates a stable feedback system. Alternatively, if OUT were between "Y" and "Z", for example point "T", then the similar feedback process will make OUT increase up to stable point "Z".

Per well-known control system theory, the dynamics of tank 404 and ZDF 406 may be designed to achieve loop stability of the system.

Figure 6:
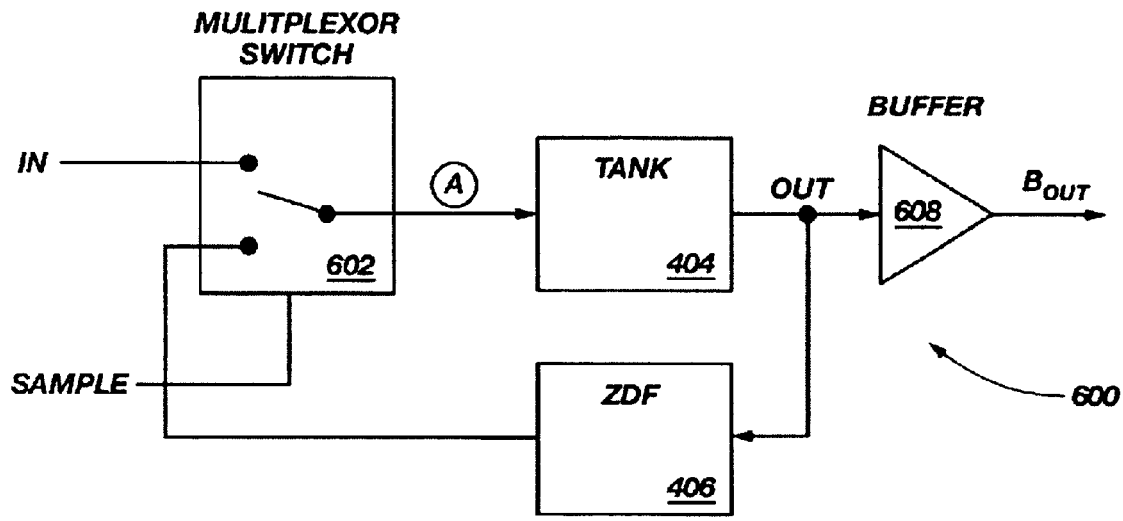
FIG. 6 is a circuit diagram of another embodiment of a zero-drift analog memory cell according to the present invention.

As an alternative embodiment a ZDAM memory cell 600 shown in FIG. 6, a multiplexer switch 602 may be used in place of switch 402 just described. This embodiment may be needed in some designs to ensure that ZDF feedback does not significantly affect node A when SAMPLE is asserted. Also according to another embodiment of a ZDAM memory cell 600, a buffer 608 may be connected to provide a buffered output, BOUT, which may be heavily loaded without affecting tank 404 or OUT.

Figure 7:
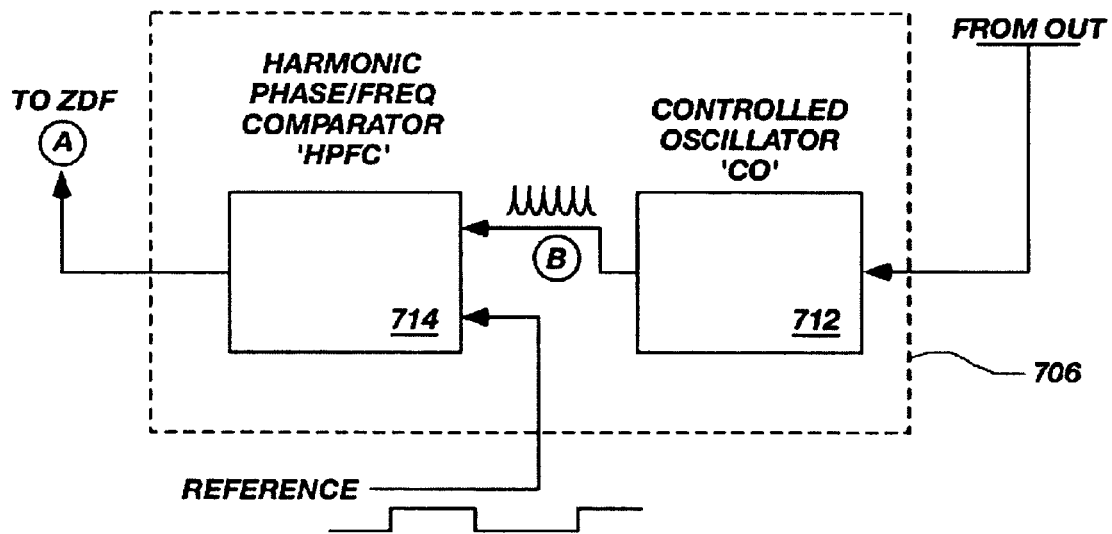
FIG. 7 is a circuit diagram of an embodiment of a zero-drift feedback according to the present invention.

An embodiment of a ZDF 706 in accordance with the present invention is shown in FIG. 7. ZDF 706 may include a controlled oscillator (CO 712 and a harmonic frequency comparator (HFC) 714. A controlled oscillator (CO) 712 is a well known element in many disciplines (neural, mechanical, electronic, etc). It produces an OSCILLATING signal at node B whose frequency varies monotonically according to the signal at OUT. Note that OUT is the input to the CO 712.

The Harmonic Phase/Frequency Comparator (HFC) 714 is a well known element used in phase-locked loops. It produces a feedback signal to node A that varies according to the difference between the frequency of harmonics of the signal at B, and the frequency or frequency of harmonics of signal REFERENCE. The REFERENCE signal is an oscillation that is preferably significantly lower in frequency than the lowest frequency produced by the CO 712. However, alternative embodiments of CO 712 may generate oscillating signals having frequencies significantly lower than the REFERENCE signal frequency, with the frequencies different by a factor greater than the number of parts of resolution desired. The parameter R=(OSCILLATING signal frequency range)/(REFERENCE signal frequency) determines the number of quantization points of an embodiment of a ZDAM memory cell 400, 600 including ZDF 706.

Figure 8:
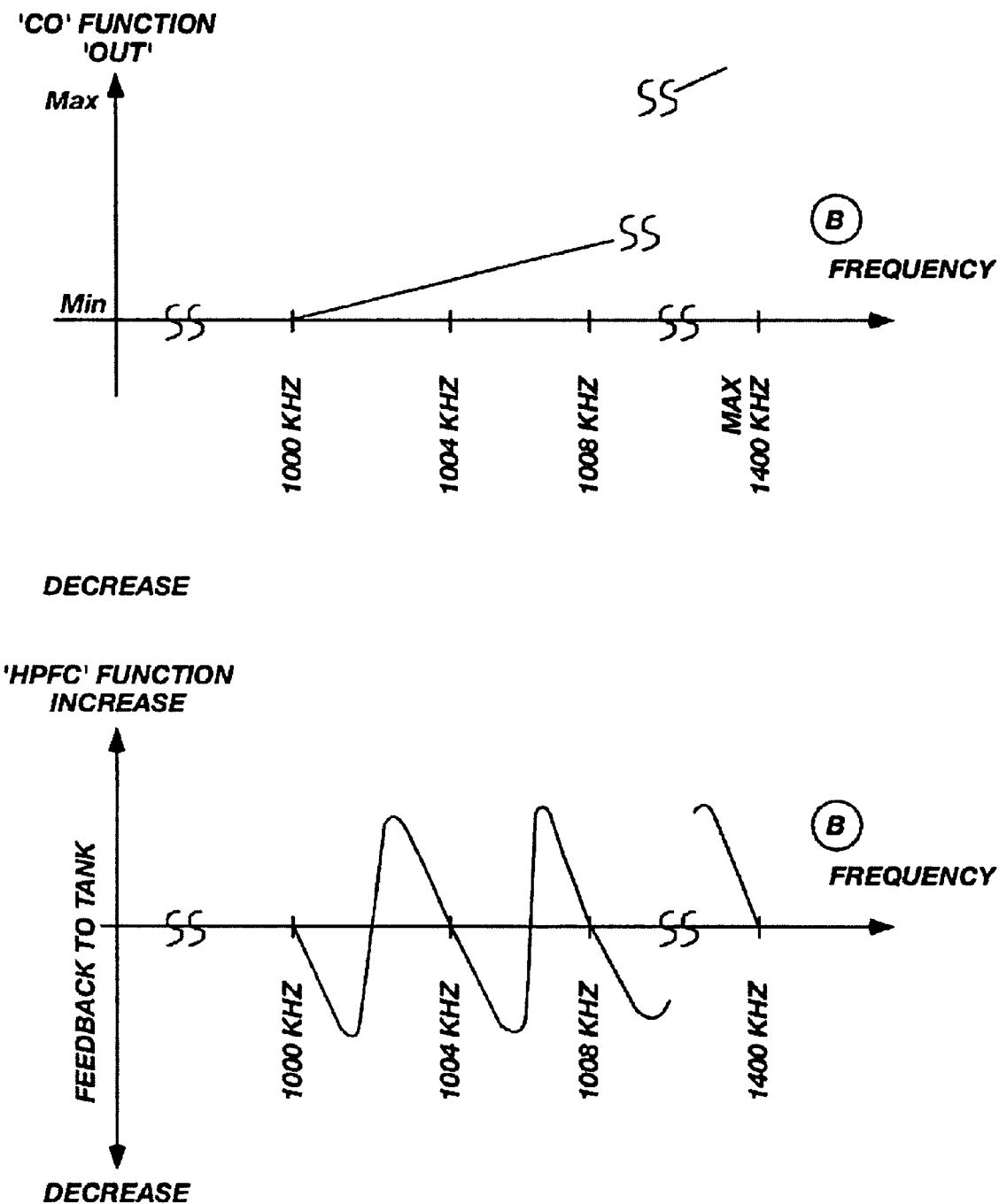
FIG. 8 is a graph of the functions of a controlled oscillator and a harmonic frequency comparator according to the present invention.

FIG. 8 is a graph of the functions of CO 712 and HFC 714. In one embodiment, the CO frequency at node B may range from 1000 kHz to 1400 kHz as a function of OUT ranging from "MIN" to "MAX", as shown in the upper graph of FIG. 8. The REFERENCE signal frequency may be, for example and not by way of limitation, 4 kHz. Also as shown in the lower graph of FIG. 8, the HFC 714 produces a feedback signal to node A that varies as a function of the frequency on node B.

The REFERENCE signal may be generated by a master oscillator in a system embodiment for which the invention is used. Alternatively, a separate oscillator may be included in an embodiment of the present invention to generate REFERENCE signal.

In a presently preferred embodiment, the frequency of oscillation of REFERENCE is stable over time. Alternatively, REFERENCE may be allowed to drift in frequency. The effect will be a corresponding drift at OUT. This invention could then be used in a system including other elements for which all numbers are represented by signals relative to this same REFERENCE frequency. Then, all signals would vary in the same way when the REFERENCE frequency drifts, effectively canceling out the effect of the drift. Permitting such drift may result in a cheaper or more robust system.

An embodiment of a CO 712 may be implemented using a voltage controlled oscillator (VCO). Many VCO implementations are commonly known. For example a VCO implementation may be such that a 0 to 5 volt sine wave oscillation is produced at a frequency of 1 MHz on signal B when the OUT signal is 0 volts and roughly linearly increasing to 1.4 MHz as OUT increases to 5 volt.

According to another embodiment of the invention, REFERENCE signal frequency may be for example 4 kHz and if the range of VCO frequencies is 400 kHz as above, then the HFC 714 generates 400 kHz/4 kHz=100 discrete stable operating points, corresponding to 100 levels of quantization of the stored signal on OUT.

Figure 9:
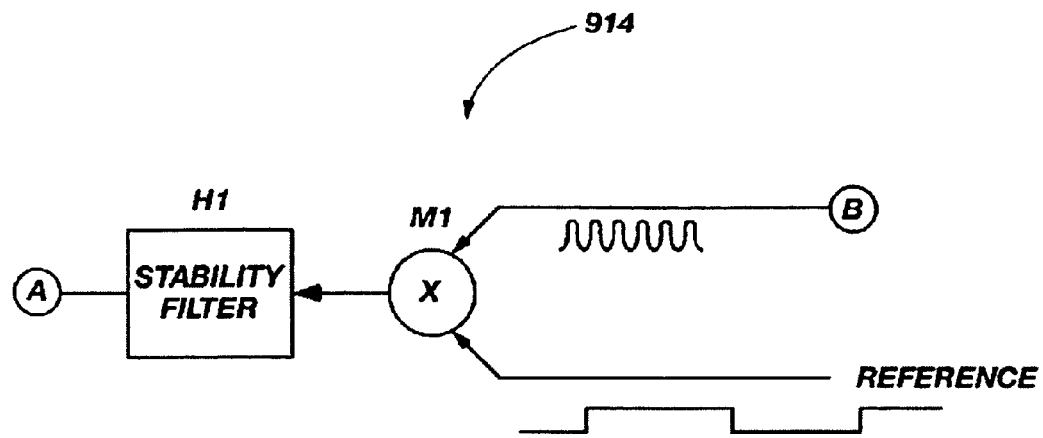
FIG. 9 is a circuit diagram of an embodiment of a harmonic frequency comparator according to the present invention.

One embodiment of an HFC 914 according to the present invention is shown in FIG. 9. HFC 914 may include a multiplier, M1, that multiplies the output of CO 712 (VCO sine wave) on node B times the REFERENCE signal (e.g., square wave). The output of M1 passes through stability filter, H1, to produce signal A, which is feedback to tank 402. H1 contains a transfer function selected to stabilize the feedback loop formed by the tank 402, CO 712, and HFC 914. The design and selection of such transfer functions for H1 including design of filters to stabilize feeback loops are known to one of ordinary skill in the art and, thus, will not be further elaborated on herein.

Figure 10:
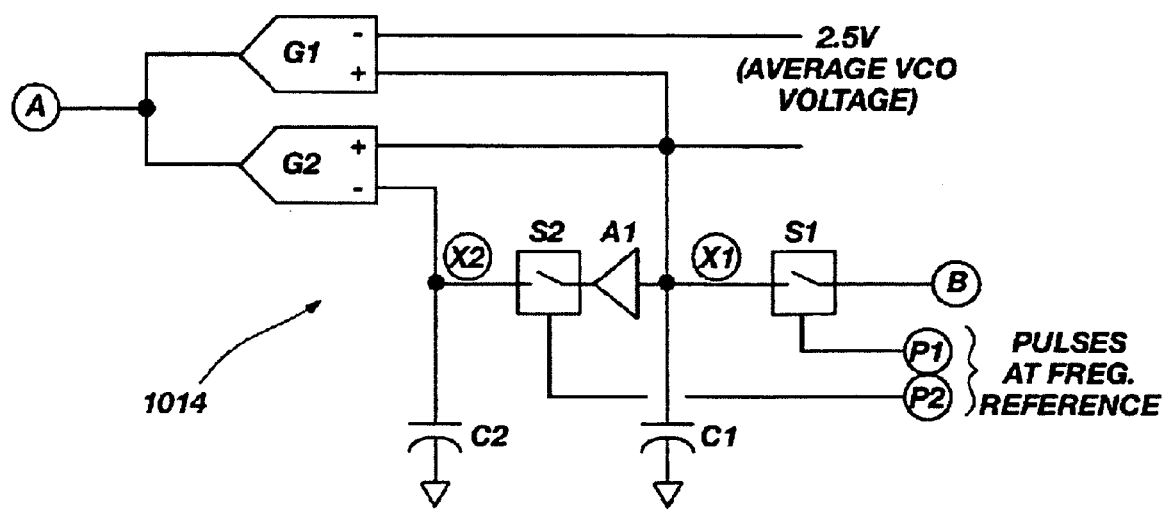
FIG. 10 is a circuit diagram illustrating another embodiment of a harmonic frequency comparator (HFC) according the present invention

FIG. 10 is a circuit diagram illustrating another embodiment of a HFC 1014 according the present invention. G1 and G2 are transconductance amplifiers which produce a current into node A in response to the differential voltages at their inputs. For example, the transconductance gain of G1 could be 0.02 nA/V and for G2, 0.01 nA/V. G1 provides current on HFC output A based on signal X1 as compared to a 2.5V signal that is the average VCO output voltage. G2 provides additional current to A that is related to the difference between the present sample on X1 and the delayed sample on X2. The purpose of G2 is to provide loop stability, and the gains of G1 and G2 are selected appropriately, considering the value of the tank capacitor (for example 1 pF) and the REFERENCE and VCO frequencies. Note that the outputs of G1 and G2 are tied together providing a current summing junction. Switches S1 and S2 can be CMOS switches. Capacitors C1 and C2 are selected large enough to provide acceptably low drift on X1 and X2 when S1 and S2 are open, over the period of REFERENCE.

Figure 11:
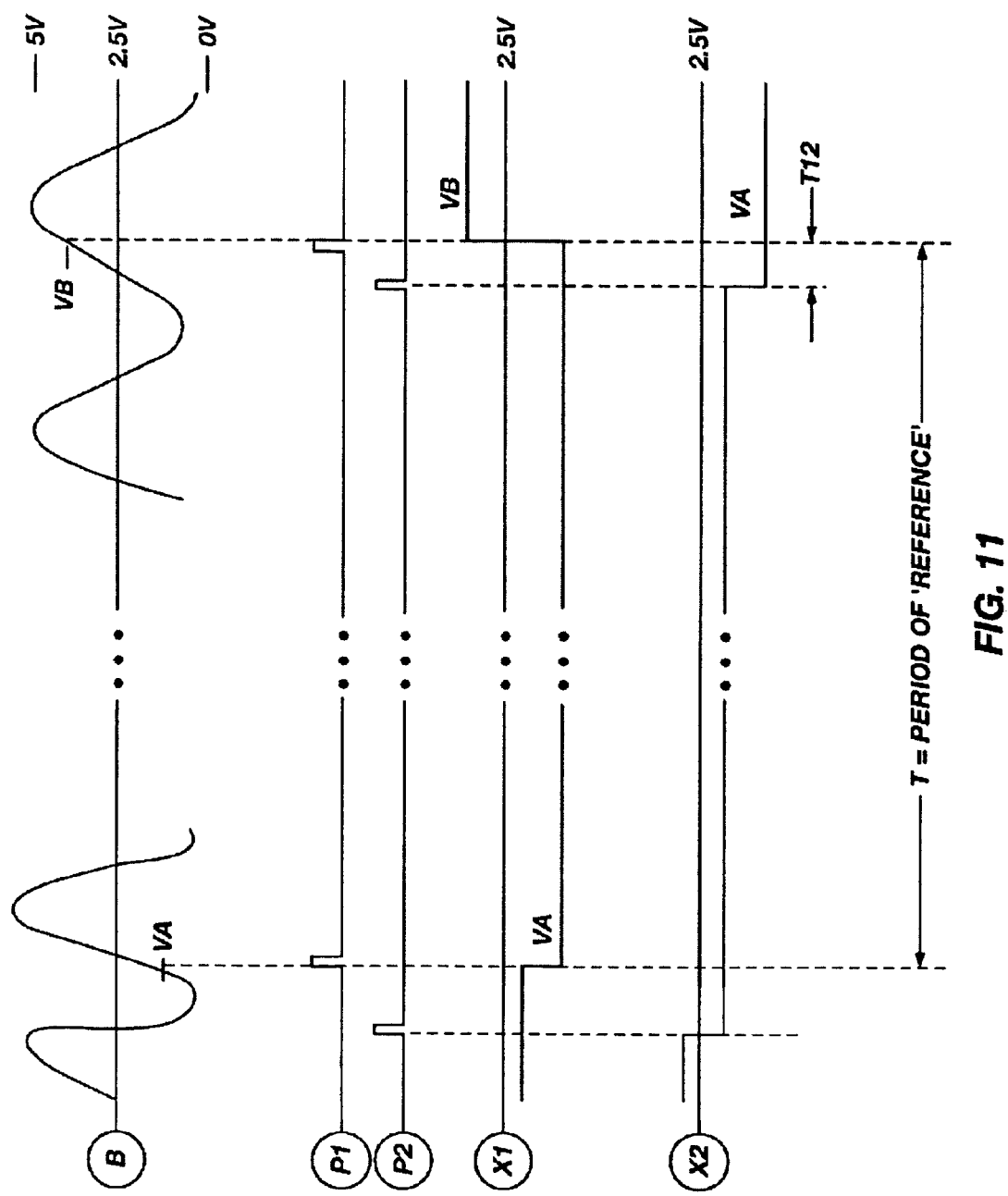
FIG. 11 shows the timing associated the HFC shown in FIG. 10.

FIG. 11 shows the timing associated the HFC 1014 shown in FIG. 10. VCO signal B is a sine wave that is sampled by switch S1 as controlled by pulses on P1. These pulses occur at the REFERENCE frequency. As shown, signal B is voltage VA when sampled by S1 at the first pulse shown on P1. Thus voltage VA is stored on capacitor C1, at node X1, and held for the duration of on REFERENCE period, as shown, until the next pulse on P1 samples B and loads VB onto X1. Switch S1 activated by pulses on P1 transfers the voltage stored on X1 onto node X1, where capacitor C2 holds that voltage as a delayed sample of B. Buffer amplifier A1 simply prevents the voltage on X1 from being attenuated during the transfer. As shown, node X1 acquires voltage VA, previously stored on X1, following the second shown pulse on P2. The timing between P1 and P2 is selected to be a convenient value T12 such that T12 is much less than T, the REFERENCE period.

Figure 12:
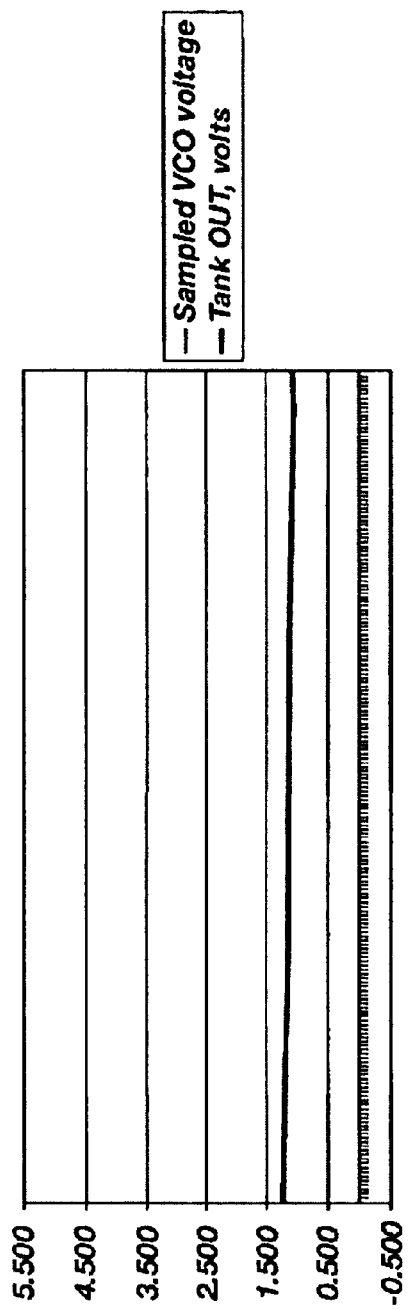
FIG. 12 is a simulation results for the embodiment shown in FIG. 10, wherein the ZDF has been deactivated.

FIG. 12 is a simulation results for the embodiment shown in FIG. 10, wherein the ZDF 406 has been deactivated, more specifically, where the HFC 1014 feedback via B has been disabled, to simulate a tank 404 without the zero-drift feedback of the present invention. The tank 402 has been initially loaded with 1.234 V, but due to tank drift, OUT is shown drifting downwards to 0.81 volts. This illustrates the tank drift problem solved by the present invention.

Figure 13:
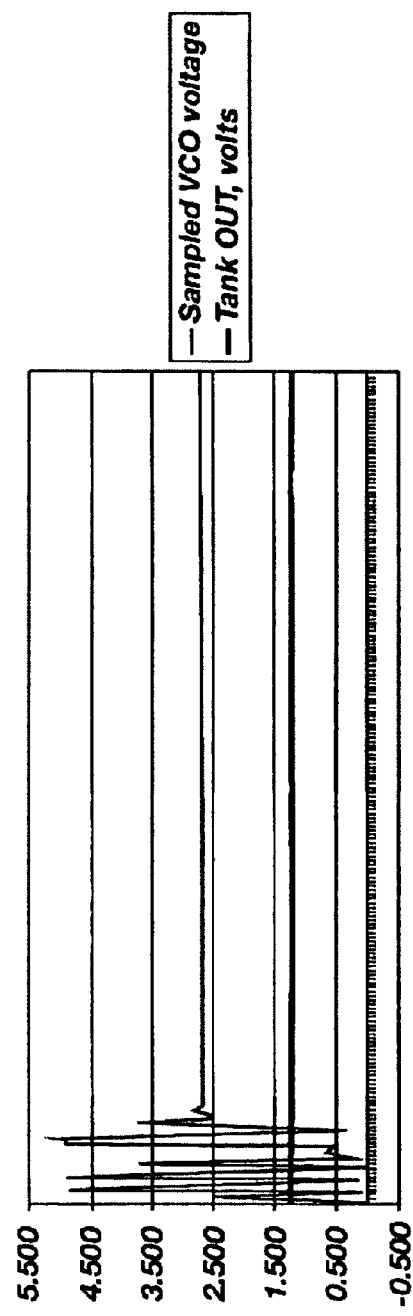
FIG. 13 shows the circuit of FIG. 10 with the HFC enabled and OUT initially set to 1.234 V.

FIG. 13 shows the circuit of FIG. 10 with the HFC 1014 enabled. OUT is initially at 1.234 V and is then "locked" to the quantized level of 1.200 V and does not drift. The samples VCO voltage, on B is shown oscillating wildly before settling down. This oscillation could be modified or significantly eliminated by a different implementation of the loop stability aspect of the HFC 1014, as is well known.

Figure 14:
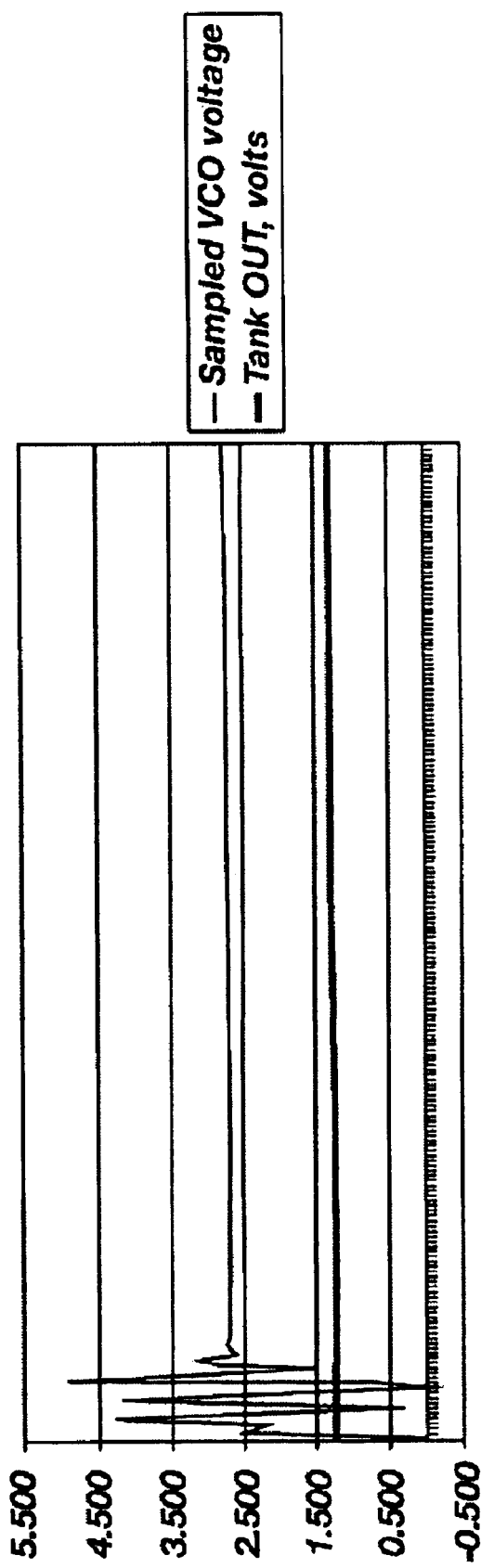
FIG. 14 again shows the circuit of FIG. 10, but with the tank and OUT initially set to 1.270 V.

FIG. 14 again shows the circuit of FIG. 10, but with the tank and initial OUT value loaded to 1.270 V. Accordingly, OUT is locked to a quantized level of 1.250 V, one step greater than in FIG. 13, illustrating the quantized levels occur every 0.050 V.

This invention description is intended to apply to various implementation disciplines, including electronic, mechanical, chemical, or biological neural systems. Within the discipline of electronic circuits, the above-described elements can be designed by one skilled in the art, and fabricated in standard IC processes to operate at standard power supply voltage.

It is to be understood that the above-described arrangements are only illustrative of the application of the principles of the present invention. Numerous modifications and alternative arrangements may be devised by those skilled in the art without departing from the spirit and scope of the present invention. The appended claims are intended to cover such modifications and arrangements.

What is claimed is:

1. A zero-drift analog memory cell, comprising:
   an input signal;
   a sample signal having sample and hold states;
   a tank for receiving the input signal and the sample signal and configured for generating and holding an output signal during the sample and hold states, respectively; and
   a zero-drift transfer function (ZDF) feedback loop disposed in parallel with the tank and configured to maintain the output signal at a desired analog signal level during the hold state.

2. The zero-drift analog memory cell according to claim 1, wherein the ZDF comprises a diatonic function having a plurality of zero crossings.

3. The zero-drift analog memory cell according to claim 2, wherein the plurality of zero crossing comprises at least 5 zero-crossings.

4. The zero zero-drift analog memory cell according to claim 3, wherein the plurality of zero crossing further comprises at least 10 zero-crossings.

5. The zero-drift and hold analog dynamic memory cell according to claim 1, wherein the ZDF does not comprise an analog-to-digital (A/D) converter.

6. The zero-drift analog memory cell according to claim 1, wherein the ZDF feedback loop comprises:
   a controlled oscillator (CO) for receiving the output signal and generating an oscillating signal; and
   a harmonic frequency comparator (HFC) for receiving a reference signal and the oscillating signal and generating a correction signal input to the tank based on a comparison between the frequency/phase of the oscillating signal and multiples of frequency on the reference signal.

7. The zero zero-drift analog memory cell according to claim 6, wherein the oscillating signal comprises a frequency monotonically correlated to the output signal.

8. The zero zero-drift analog memory cell according to claim 6, wherein the reference signal comprises a periodic signal having a reference frequency.

9. The zero-drift analog memory cell according to claim 8, wherein the reference signal further comprises a square wave having a duty cycle selected from the range greater than 0% up to about 50%.

10. The zero-drift analog memory cell according to claim 8, wherein the reference signal further comprises a signal having periodic pulses or spikes.

11. The zero-drift analog memory cell according to claim 8, wherein a frequency of the oscillating signal is greater than 5 times the reference frequency.

12. The zero-drift analog memory cell according to claim 8, wherein the reference frequency is greater than 5 times a frequency of the oscillating signal.

13. The zero-drift analog memory cell according to claim 8, wherein the reference frequency is stable during a hold state.

14. The zero-drift analog memory cell according to claim 6, wherein the CO comprises a voltage controlled oscillator.

15. The zero-drift analog memory memory cell according to claim 6, wherein the tank comprises an electronic circuit.

16. The zero-drift analog memory cell according to claim 6, wherein the tank comprises a capacitor.

17. The zero-drift analog memory cell according to claim 6, wherein the tank further comprises a high impedance buffer for receiving the output and outputting a buffered output.

18. The zero-drift analog memory cell according to claim 6, wherein the HFC comprises a nonlinear combination of the oscillating signal and the reference signal.

19. The zero-drift analog memory cell according to claim 18, wherein the nonlinear combination comprises multiplication.

20. The zero-drift analog memory cell according to claim 6, wherein the HFC comprises:
   a multiplier for receiving the oscillating signal and reference signals and generating a modulated signal; and
   a stability filter for receiving the modulated signal and generating the correction signal.

21. The zero-drift analog memory cell according to claim 20, wherein the stability filter comprises a transfer function to stabilized a feedback loop formed by the tank, CO and HFC.

22. The zero-drift analog memory cell according to claim 6, wherein the HFC comprises two transconductance amplifiers having outputs tied together for generating the correction signal.

23. The zero-drift analog memory cell according to claim 1, further comprising a switch for receiving the input signal and outputting the input signal in response to assertion of the sample state.

24. The zero-drift analog memory cell according to claim 23, wherein the tank comprises a transistor.

25. The zero-drift analog memory cell according to claim 6, wherein the input and output signals comprise analog voltages.

26. The zero-drift analog memory cell according to claim 6, wherein the input and output signals comprise optical signals.

27. The zero-drift analog memory cell according to claim 6, wherein the input and output signals comprise chemical signals.

28. The zero-drift analog memory cell according to claim 6, wherein the input and output signals comprise mechanical signals.

29. The zero-drift analog memory cell according to claim 6, wherein the input and output signals comprise magnetic signals.

30. A zero zero-drift analog memory array comprising a plurality of zero-drift and hold analog memory cells, each cell comprising:
   an input signal;
   a sample signal having sample and hold states;
   a tank for receiving the input signal and the sample signal and configured for generating and holding an output signal during the sample and hold states, respectively; and a zero-drift transfer function (ZDF) feedback loop disposed in parallel with the tank and configured to maintain the output signal at a desired analog signal level during the hold state.

31. The zero-drift analog memory array according to claim 11, wherein the ZDF feedback loop comprises:

a controlled oscillator (CO) for receiving the output voltage signal and generating an oscillating signal; and a harmonic frequency comparator (HFC) for receiving a reference signal and the oscillating signal and generating a correction signal for input to the tank based on a comparison between the frequency/phase of the oscillating signal and multiples of frequency on the reference signal.

32. The zero-drift analog memory array according to claim 14, wherein the CO comprises a voltage controlled oscillator.

33. The zero-drift analog memory array according to claim 14, wherein the HFC comprises:

a multiplier for receiving the oscillating signal and reference signals and generating a modulated signal; and a stability filter for receiving the modulated signal and generating the correction signal.

34. The zero-drift analog memory array according to claim 16, wherein the stability filter comprises a transfer function to stabilized a feedback loop formed by the tank, CO and HFC.

35. The zero-drift analog memory array according to claim 14, wherein the HFC comprises two transconductance amplifiers having outputs tied together for generating the correction signal.

36. A method for receiving an analog input signal and generating a stable analog output signal, said method comprising:

providing a tank for sampling and holding the input signal, during sample and hold states, respectively;

providing a zero-drift transfer function (ZDF) feedback loop in parallel with the tank circuit;

sampling the input signal during the sample state to generate an output signal; and maintaining the output signal at a desired signal level by eliminating output signal drift using the ZDF feedback loop.

37. The method according to claim 36, wherein, providing the ZDF feedback loop comprises providing:

a controlled oscillator (CO) for receiving the analog output signal and generating an oscillating signal; and a harmonic frequency comparator (HFC) for receiving a reference signal and the oscillating signal and generating a correction signal input to the tank based on a comparison between the frequency/phase of the oscillating signal and multiples of frequency on the reference signal.

* * * * *